(12) United States Patent
Chandrasekhar

(10) Patent No.: US 6,294,821 B1
(45) Date of Patent: Sep. 25, 2001

(54) SINGLE-CHIP WAVELENGTH CONVERTER

(75) Inventor: Sethumadhavan Chandrasekhar, Matawan, NJ (US)

(73) Assignee: Agere Systems Optoelectronics, Orlando, FL (US)

( * ) Notice: Subject to any disclaimer, the term of this patent is extended or adjusted under 35 U.S.C. 154(b) by 0 days.

(21) Appl. No.: 09/328,273

(22) Filed: Jun. 8, 1999

(51) Int. Cl.[7] .......................... H01L 31/05; H01L 31/075; H01L 31/105

(52) U.S. Cl. .............. 257/458; 257/21; 257/80; 385/14

(58) Field of Search ................. 257/21, 80, 458; 385/14

(56) References Cited

U.S. PATENT DOCUMENTS

| | | | |
|---|---|---|---|
| 5,063,426 | 11/1991 | Chandrasekhar et al. | 257/458 |
| 5,577,139 | * 11/1996 | Chandrasekhar | 385/14 |
| 5,745,271 | * 4/1998 | Ford et al. | 359/130 |
| 5,991,060 | * 11/1999 | Fishman et al. | 359/187 |

FOREIGN PATENT DOCUMENTS

JP-3-269226-A  * 11/1991 (JP) .

OTHER PUBLICATIONS

S.J.B. Yoo, "Wavelength Conversion Technologies for WDM Network Applications," 14 Journal of Lightwave Technology p. 955 (Jun. 1996).

Thomas H. Wood, "Multiple Quantum Well (MQW) Waveguide Modulators," 6 Journal of Lightwave Technology p. 743 (Jun. 1988).

* cited by examiner

*Primary Examiner*—Eddie Lee
*Assistant Examiner*—Allan R. Wilson

(57) ABSTRACT

A high performance photodetector is integrated with a high performance modulator and a resistor on a single semiconductor substrate, all three sharing a common node. Voltage biases are applied to each of the diodes of the photodetector and modulator. As light is incident on the photodetector a current is generated which causes a voltage drop across the resistor. The voltage across the modulator then becomes the difference between its voltage bias and the voltage drop across the resistor. By properly selecting a resistor any desirable voltage swing is achieved without electrical amplifiers. Since the device is primarily optical and on a single semiconductor substrate, the device is independent of data rate, subject only to the inherent timing constant of the circuit.

15 Claims, 5 Drawing Sheets

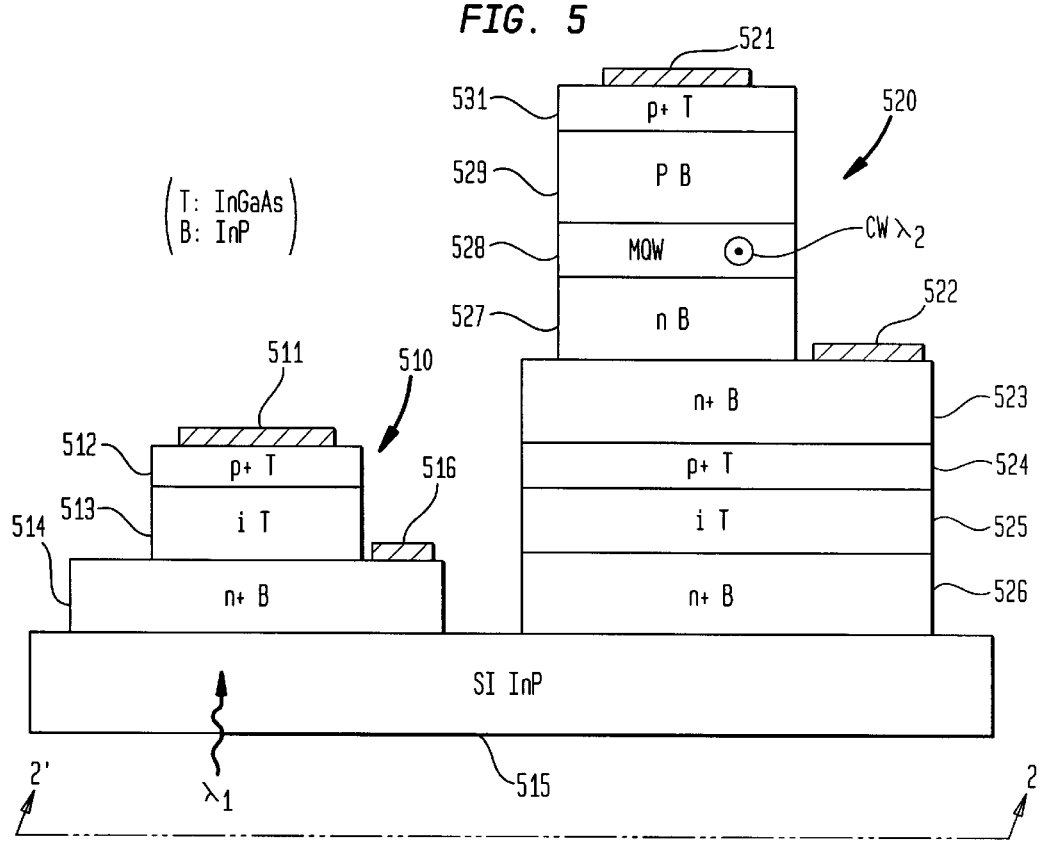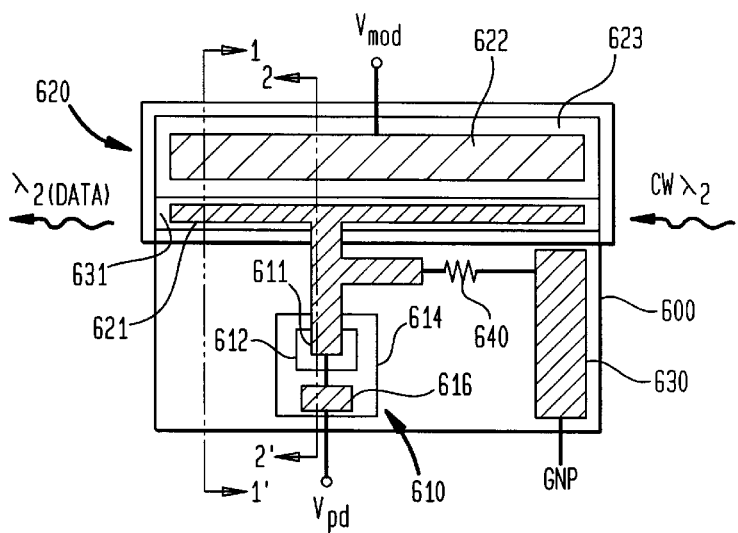

SINGLE-CHIP WAVELENGTH CONVERTER

FIELD OF THE INVENTION

The present invention relates generally to the field of optical communications and in particularly relates to an integrated optical wavelength converter fabricated on a single chip.

BACKGROUND OF THE INVENTION

Wavelength conversion and converters are well known in the art of communications and specifically as it relates to wavelength division multiplexed lightwave networks. In general, data carried on an incident light wave at a first wavelength $\lambda_1$ may be transferred to a second light wave at $\lambda_2$, by modulating a continuous lightwave ("CW") at $\lambda_2$.

Referring to FIG. 1 an example of a prior art wavelength converter is shown. A light wave at $\lambda_1$ is shown incident at a photodetector 10, shown for purposes of illustration as a photodiode. The resulting electrical current output from detector 10 may pass through a pre-amplifier 20 such as shown, typically used to amplify the electrical signal to an intermediate level without degrading the signal to noise ratio of the signal. Thereafter, the signal is further amplified as it passes through amplifier 30 and followed by the last amplifier, also referred to as driver 40. The output from driver 40 and CW light at $\lambda_2$ are input to modulator 50. Modulator 50 takes the electrical data from driver 40, modulates the CW light at $\lambda_2$ and outputs a lightwave at $\lambda_2$ carrying the original incident data.

The amplification stage between detection and modulation is necessary because the incident signal may be at a low voltage level on the order of millivolts, while the modulator will typically require anywhere from 1–6 volts peak to peak. More specifically, a modulator such as 50 shown in FIG. 1 may be manufactured from Lithium Niobate, in which case it will require 3 to 6 volts peak to peak. Alternatively, the modulator may be manufactured from semiconductor material in which case 1–3 volts should be sufficient. In either case, amplification is necessary.

The drawback of the wavelength converter of FIG. 1 is that it includes electrical connections and devices. The electrical components are sensitive to data transmission rates and should have sufficient electrical bandwidth to operate at the data transmission rate. As bit rates increase, obtaining amplifiers with the proper bandwidth becomes a challenge. While connections can be fabricated to accept the higher bit rates, such as in the range of gigabytes, they must also be compatible with the amplifiers they inter-connect which traditionally have ratings of 50 ohms. Accordingly, in light of ever increasing demand for higher data transfer rates, it is desirable to reduce the constraints created by the electrical elements in the circuit, e.g. transistors, capacitors and wiring.

Referring to FIG. 2 an alternative wavelength converter is shown which is known in the art as a Semiconductor Optical Amplifier ("SOA"). SOA 60 is a single semiconductor material whose properties allow for the amplification and modulation of an incident light wave into a second wavelength. SOA 60 accepts two inputs: the data at $\lambda_1$ and the CW at $\lambda_2$. Direct current voltage is applied to the device and the data is output at an amplified level and at $\lambda_2$. The process of SOA 60 is also referred to as cross gain modulation and is more fully described in S. J. B. Yoo, "*Wavelength Conversion Technologies for WDM Network Applications,*" in 14 Journal of Lightwave Technology p. 955 (1996), hereby incorporated by reference as if fully set forth herein.

While for certain applications an SOA may be the device of choice, as compared with the opto/electronic wavelength converter of FIG. 1, it suffers certain drawbacks, including the introduction of certain non linear noise into the signal.

SUMMARY OF THE INVENTION

The subject invention addresses the inefficiencies and drawbacks identified above with respect to the prior art wavelength converters and introduces a new single-chip wavelength modulator without the electrical amplifier components found in the prior art. A high performance photodetector is integrated with a high performance modulator and a resistor on a single semiconductor substrate. DC biases are applied to each of the diodes of the photodetector and modulator. As light is incident on the photodetector a current is generated which causes a voltage drop across the resistor. The voltage across the modulator then becomes the difference between its DC bias and the voltage drop across the resistor. By properly selecting a resistor any desirable voltage swing can be achieved without electrical amplifiers. Furthermore, since the device is primarily optical and on a single semiconductor substrate the device is independent of data rate, subject only to the inherent timing constant of the circuit.

BRIEF DESCRIPTION OF THE DRAWINGS

FIG. 5 is a cross sectional side view of one embodiment of a single-chip wavelength converter fabricated such that input and output light waves are incident on the chip on orthogonal planes.

FIG. 6A is a plan view of a single-chip wavelength converter in accordance with the present invention also fabricated such that input and output light waves are incident on the chip on orthogonal planes.

DETAILED DESCRIPTION OF THE INVENTION

Figure 1:
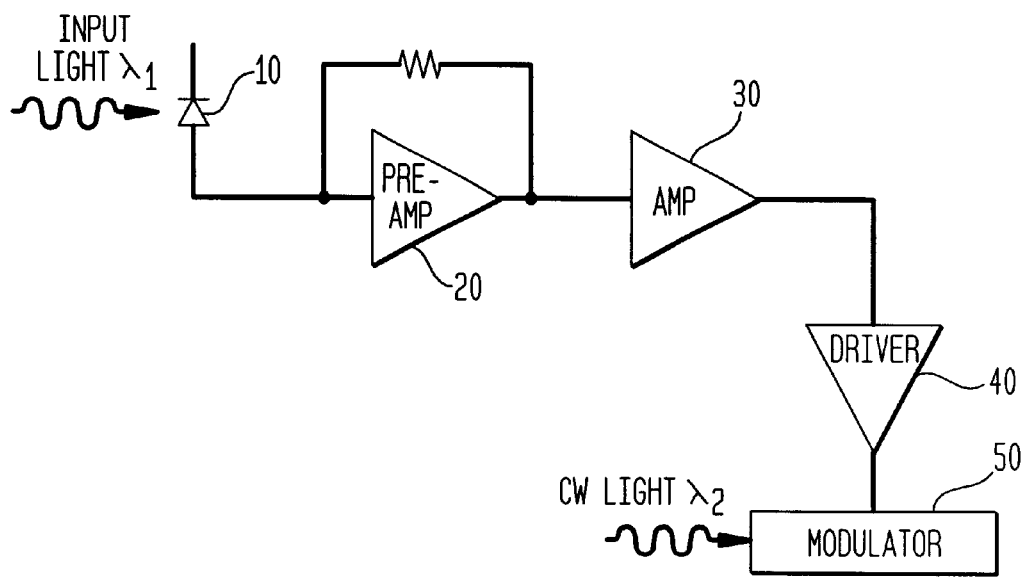
FIG. 1 is a schematic of a prior art opto/electronic wavelength converter.
Figure 2:
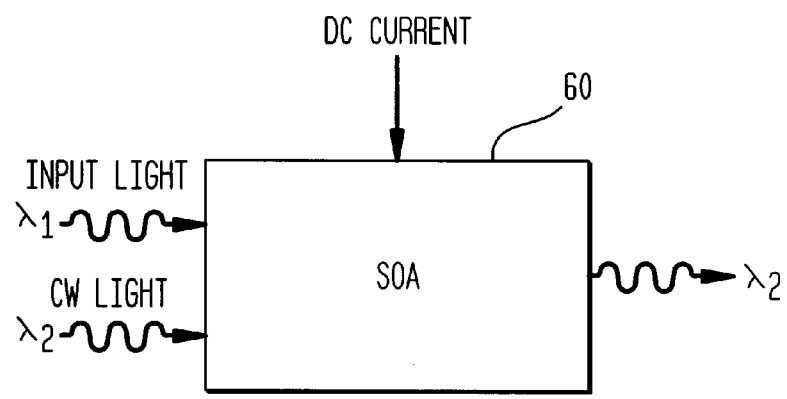
FIG. 2 is a block diagram of a prior art semiconductor optical amplifier.
Figure 3:
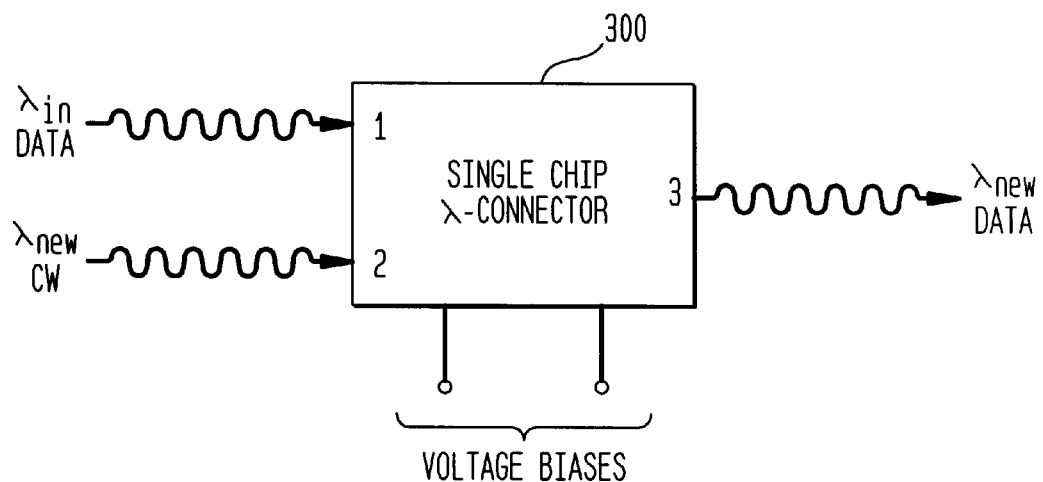
FIG. 3 is a block diagram of one embodiment of a single-chip wavelength converter of the present invention.

The present invention provides a wavelength converter on a single chip as generally illustrated by the block diagram of FIG. 3. The chip 300 receives two light wave inputs, the data carrying light waves at $\lambda_1$ and the continuous light wave at $\lambda_2$, and two voltage biases. The output is a single light wave carrying the incident data at $\lambda_2$.

Figure 4:
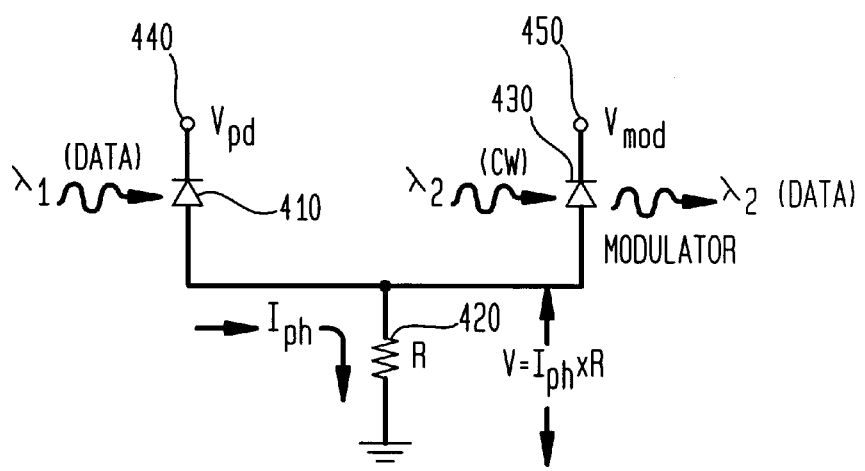
FIG. 4 is a schematic of one embodiment of the single-chip wavelength converter of the present invention.

Referring to FIG. 4, a generalized schematic of the present invention illustrates the components which are to be fabricated on the semiconductor chip and will assist in understanding the circuit analysis of the device of the present invention. Photodetector 410 is biased with voltage 440, also denoted as $V_{pd}$. Photodetector 410 is in series with resistor 420 having a resistance R, sharing a common node N. Resistor 420 is also in series with modulator 430, which is biased with voltage 450, also denoted as $V_{mod}$. Modulator 430 also shares common node N.

The data carrying light wave $\lambda_1$ is incident on photodetector 410. A current $I_{ph}$ is induced across resistor 420 causing a voltage drop V across resistor 420 equal to the product of $I_{ph}$ and R. Since resistor 420 is in series with modulator 430, the voltage drop across the modulator must also be $V_{mod}$-V. It will be obvious then to one skilled in the art that any desirable voltage across modulator 430 is obtainable by fabricating the device of the present invention with a resistor 420 having an appropriately sized resistance R. Thus amplification is achieved without the traditional multi-step amplification process using electrical devices and their interconnections.

In systems where R is pre-set the particular voltage drop across modulator 430 will depend on the current $I_{ph}$ induced across resistor 420. $I_{ph}$ is a function of the power of the incident light wave $\lambda_1$ and the responsivity of the photodetector 410. For a given photodetector 410 it may be necessary to amplify light wave $\lambda_1$ before it is incident on photodetector 410 in order to assure a sufficient current that will provide a large enough voltage drop across modulator 430. Methods and devices for amplification of light waves are well known in the art and those skilled in the art will readily understand how to apply those methods and devices to the single-chip wavelength converter of the present invention. For illustrative purposes, one such known class of optical amplification devices are known as EDFAs, or Eribium Doped Fiber Amplifiers which are glass fibers capable of 1000× amplification.

The benefits of the present invention will be readily apparent to those skilled in the art. For example, the present invention does not use or need high speed electrical connections external to the chip. The chip requires only three fiber leads for the two input and one output light waves, and two voltage bias leads. The high speed current voltage signals are confined internally and therefore eliminate any electrical mismatch, reflections, terminations, or connectors.

Since high speed electrical connections are avoided, the value R of resistor 420 can be selected with a greater degree of freedom than if the components were individually packaged and required high speed connections. Furthermore, R can be selected with values greater than 50 ohms as is available with conventional amplifiers, so as to develop larger voltage drops across modulator 430 for a given incident optical power on photodetector 410.

In addition, the device is bit rate independent and could be wavelength independent if the modulator can be designed to have a wide wavelength bandwidth. With respect to bit rate it should be noted that the converter circuit in its entirety has an inherent limit on the speed through which the conversion takes place which is defined by the product of the resistance of the circuit and the capacitance of the circuit. In one preferred embodiment of the present invention where the photodetector and modulator are p-i-n diodes as described more fully below, the capacitance of the circuit is the combined capacitance of the two diodes. However, clearly the RC limit can be set by selecting appropriate values of C or R.

The single-chip wavelength converter of the present invention can be fabricated in various embodiments. Several variations are discussed below for purposes of illustration only. These embodiments are not intended to limit the present invention, the scope of which is defined by the claims found below. Referring to FIG. 5, a cross sectional side view of one advantageous embodiment of the present invention is shown. In the embodiment of FIG. 5 the input fiber (not shown) for light wave $\lambda_1$ is normal to the underside of the substrate 515 of the chip, while fibers (not shown) for input light wave $\lambda_2$ and output light wave $\lambda_2$ will be parallel to the surface of the chip.

To minimize the complexity of the following discussion, details of the fabrication of the semiconductor devices described herein and various alternatives will be avoided as it is ancillary to the crux of the invention. As shown in FIG. 5 the chip includes substrate 515 which is advantageously selected from a semi-insulating material. One such traditionally preferred material, especially in the field of photonics, is indium phosphide (InP). The three components of the converter of the present invention: the photodetector, the resistor and the modulator are fabricated on this substrate.

The photodetector 510 is shown as a p-i-n diode which is well known in the art and is described in more detail in U.S. Pat. No. 5,063,426 issued to the same inventor herein and commonly assigned, hereby incorporated by reference as if full set forth herein. Other photodetectors such as those fabricated from phototransistors may be used as well. The $n_+$doped region 514 of photodetector 510 includes a contact 516 which is used to connect to a voltage source (not shown). The B notation indicates that it may advantageously be fabricated from a binary semiconductor such as indium phosphide (InP). The intermediate region 513 denoted as "i"for intrinsic semiconductor may in practice be slightly doped. Region 512 is $p^+$ doped and is capped with a contact 511 for connecting to the resistor (not shown) and modulator 520 through contact 521. The i and $p^+$ regions, 513 and 512, respectively are denoted with the letter T to indicate a ternary semiconductor, such as indium gallium arsenide (InGaAs).

Modulators such as modulator 520 shown in FIG. 5 are well known in the art and will not be described herein in complex detail. Modulator 520 is shown with some degree of detail in an advantageous embodiment which will be appreciated by those skilled in the art. Regions 523 and 527, while slightly differently doped, collectively behave as the n junction of the modulator. Regions 524, 525 and 526 act as a support for the modulator. The use of multiple support regions and the semi-conductor material from which they are formed are design elements well known to those skilled in fabricating modulators.

As shown, region 526 is $n^+$ doped and may advantageously be fabricated from a binary semiconductor, while the i and $p^+$ regions, 525 and 524, may be advantageously fabricated from a ternary semiconductor. Contact 522 is used to connect with a second voltage source (not shown) as illustrated in FIGS. 3 and 4.

Regions 529 and 531 collectively comprise the p region of the modulator and may be advantageously fabricated from binary and tertiary materials as denoted. Region 528 represents the modulator intrinsic region in which the continuous wave of light at $\lambda_2$ is input and the modulated data carrying light wave at $\lambda_2$ is output. In the embodiment shown in FIG. 5, region 528 is a multiple quantum well. Generally, multiple quantum wells are fabricated as one or more narrow bandwidth semiconductor material, sandwiched between wide bandwidth material. Multiple sandwiches of this type can be deposited one on top of the other for reason beyond the scope of this application. The narrow bandwidth material may be ternary material and the wide bandwidth material, binary or quaternary semi-conductor material.

Alternatively, the modulator intrinsic region my be formed from one bulk material which advantageously may be selected from a quaternary material such as indium dallium arsenide phosphide ("InGaAsP"). A more detailed discussion of multiple quantum wells is beyond the scope of the present invention, but is more fully described in T. H. Wood, "*MQW Waveguide Modulators,*" in 6 Journal of Lightwave Technology p.743 (1988), hereby incorporated by reference as if fully set forth herein.

Connecting regions 512 and 531 through contacts 511 and 521, respectively without shorting out any of the other layers of semiconductor material there between can be achieved by covering the exposed surfaces of the substrate and various regions with a dielectric such as polyimide and laying the connection between 511 and 521, which in reality is on metal contact, on top of the dielectric. This process is described in more detail in U.S. Pat. No. 5,063,426, identified above and previously incorporated by reference.

Referring to FIG. 6A the embodiment shown in FIG. 5 (cross-section taken along 2–2' shown in FIG. 6A) is shown in plan view. Being a plan view, only incoming continuous light wave $\lambda_2$ and output light wave $\lambda_2$ can be seen as input light wave $\lambda_1$ is incident perpendicular to the underside of the substrate and is therefore not visible in this view. What is visible however, in FIG. 6A is the interconnection between the photodetector 610, the resistor 640 and the modulator 620.

As shown a continuous light wave at $\lambda_2$ is incident on modulator 620 and a data carrying light wave at $\lambda_1$ is output from modulator 620. As can be seen from the plan view a first contact connecting modulator 620, photodetector 610 and resistor 640 is continuous. However, to facilitate the description the regions of contact corresponding with each of the three components are separately numbered. Contact 621 is formed on top of the p layer 631 of modulator 620 and continues to the top of the p layer 612 of photodetector 610 and to the resistor 640. Resistor 640 may be fabricated in any manner and from any material known in the art. In one advantageous embodiment resistor 640 is formed from evaporated nickel chrome metal film.

Referring further to FIG. 6A the second terminal of resistor 640 is connected to a contact 630, which is distinct from the first contact and grounded. Two additional and separate contacts 616 and 622 are visible in FIG. 6A on top of the n region 614 of photodetector 610 and the n region 623 of modulator 620, respectively. These two contacts are shown connected to the $V_{pd}$ and $V_{mod}$ biases.

Figure 6B:
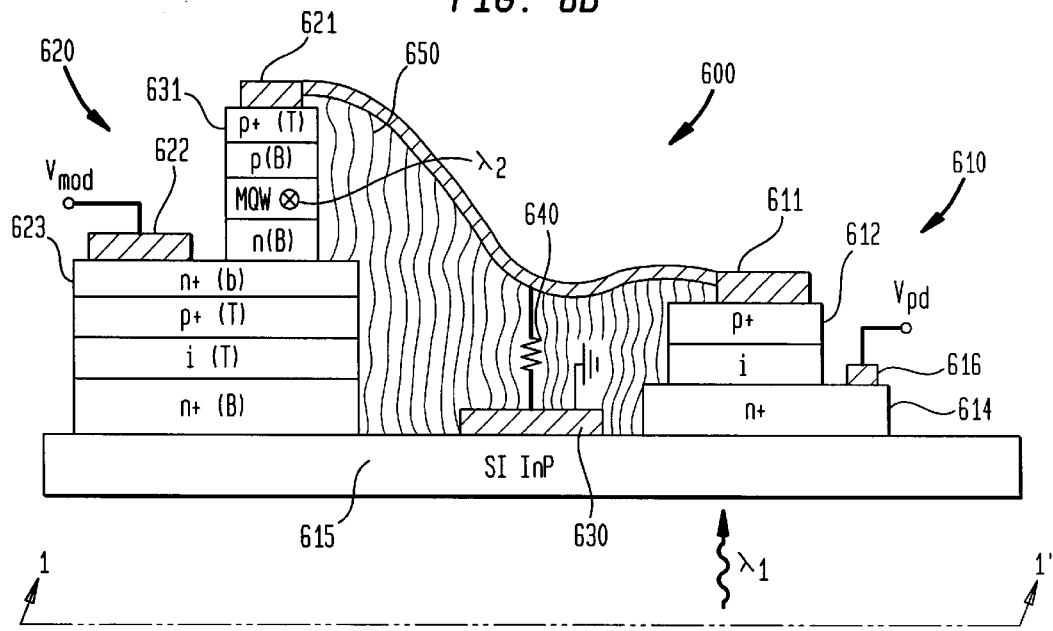
FIG. 6B is a cross sectional side view of the single-chip wavelength converter shown in FIG. 6A.
Figure 6C:
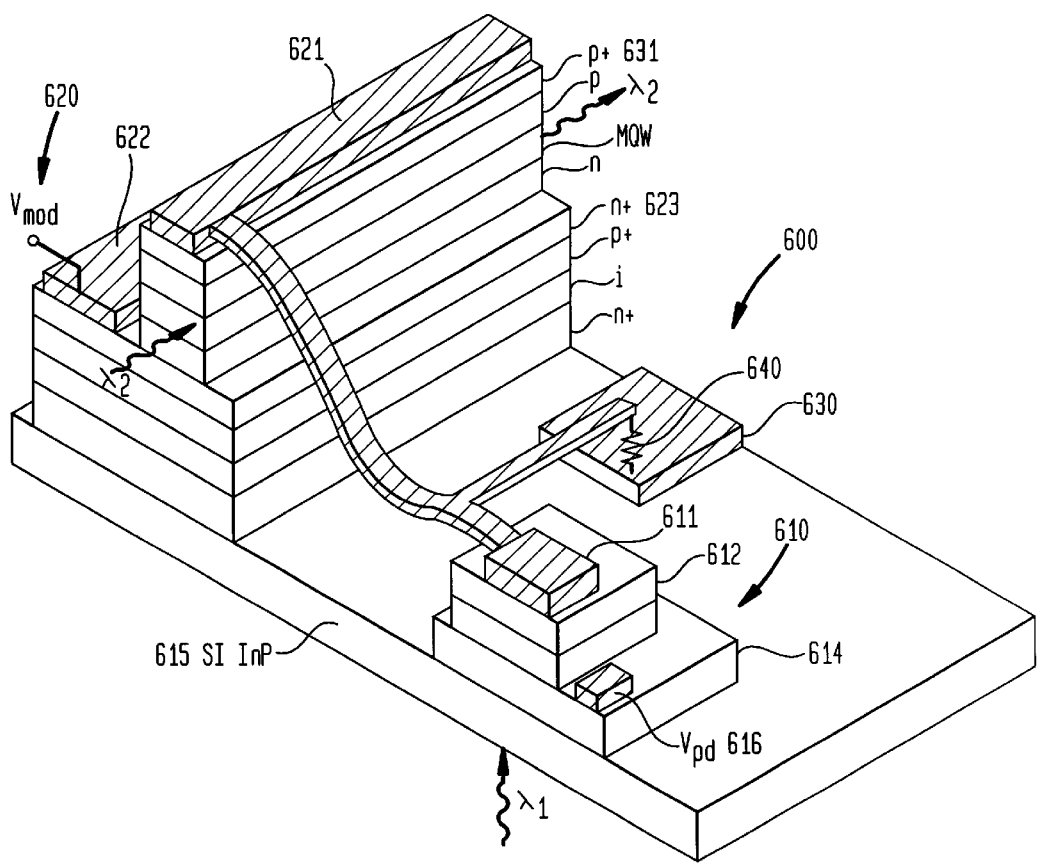
FIG. 6C is a three dimensional oblique view of the single-chip wavelength converter of FIGS. 6A and 6B.

FIG. 6B is a cross sectional side view of the single chip 600 of FIG. 6A, along cut 1–1'. This view differs from that in FIG. 5 as more detail is illustrated, including the resistor component, the dielectric and the interconnection between components. In this view the data carrying light wave $\lambda_1$ having a normal incidence to the underside of substrate 615. The cross hatching 650 under the continuous contact adjoining photodetector 610, resistor 640 and modulator 620 represents the dielectric material discussed above. Referring to FIG. 6C, a three-dimensional oblique view of the same single chip 600 of the prior two figures, is shown for additional perspective.

Figure 7:
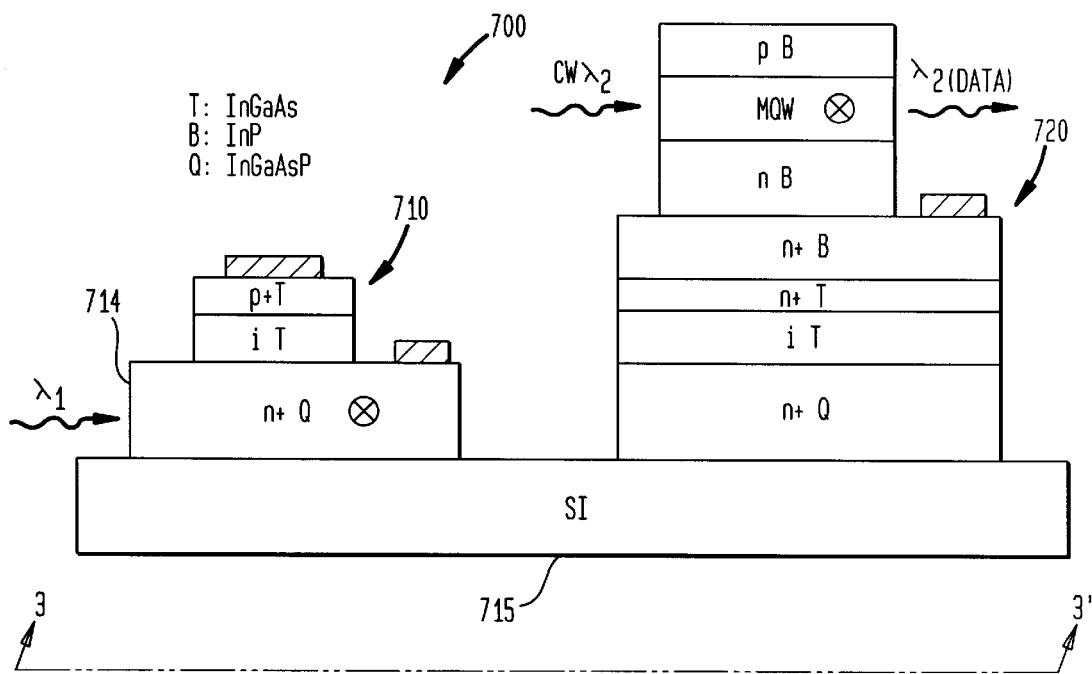
FIG. 7 is a cross sectional side view of a third embodiment of a single-chip wavelength converter fabricated such that input and output light waves are incident on the chip on parallel planes.

Referring to FIG. 7 another embodiment of the single chip wavelength converter of the present invention is shown. This embodiment differs from the prior embodiment in that the p-i-n photodetector 710 is fabricated as a waveguide. This is accomplished for example, by fabricating the n+region 714 of photodetector 710 from a quaternary semiconductor such as indium gallium arsenide phosphide ("InGaAsP"). In this manner the data carrying light wave at $\lambda_1$ can be incident along the same or parallel planes as the continuous light wave and output light wave, both at $\lambda_2$.

Figure 8:
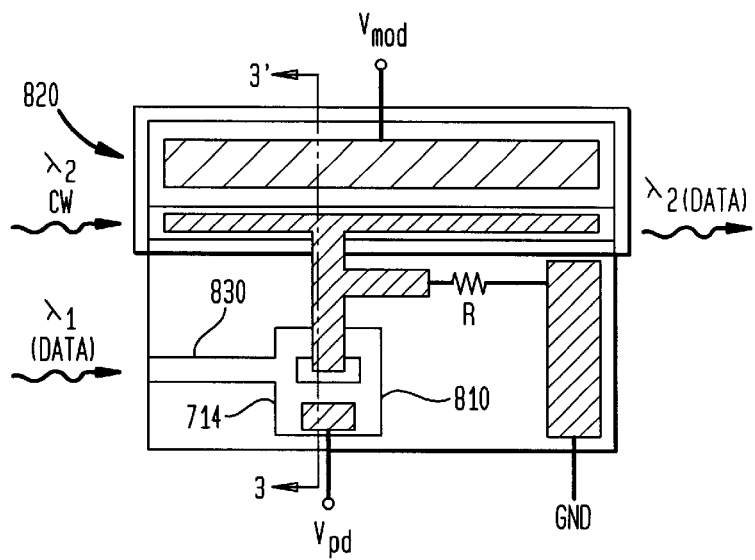
FIG. 8 is a plan view of a fourth embodiment of a single-chip wavelength converter fabricated such that input and output light waves are incident on the chip on parallel planes.

This is a practical application where the fiber attachments to the single chip 700 are all in one plane. The fibers are coupled to the chip at cleaved facets along side of the chip and a waveguide is formed in the chip through the n+region 714 through which the light waves travel until absorbed in the photodetector 710. FIG. 8 is a plan view of the single chip wavelength converter whose cross-section along line 3–3' is shown in FIG. 7. In FIG. 8, waveguide 830 leading to photodetector 810 can be seen.

It will be understood by those skilled in the art of integrated circuits and fiber optics that the combination of the photodetector and modulator on a single chip can be used for implementation of other functional photonic subsystems besides a wavelength converter. The foregoing merely illustrates the principles of the present invention. Those skilled in the art will be able to devise various modifications, which although not explicitly described or shown herein, embody the principles of the invention and are thus within its spirit and scope.

What is claimed is:

1. An integrated single-chip wavelength converter, comprising:

a photodetector for receiving an incident data carrying light wave at a first wavelength;

a resistor in a first series circuit with said photodetector; and a modulator in a second series circuit with said resistor, said photodetector, resistor and modulator sharing at least one common node, said modulator for receiving a continuous light wave at a second wave length and modulating said continuous light wave with said data to output a light wave at a second wave length, carrying said data.

2. The integrated single-chip wavelength converter of claim 1 further comprising at least one interface for receiving a first voltage bias across said photodetector and a second voltage bias across said modulator.

3. The integrated single-chip wavelength converter of claim 1 further comprising:

a first voltage bias across said photodetector; and a second voltage bias across said modulator.

4. The integrated single-chip wavelength converter of claim 1 wherein said photodetector is a p-i-n photodetector.

5. The integrated single-chip wavelength converter of claim 4 wherein said n layer of said p-i-n photodetector is n+ doped.

6. The integrated single-chip wavelength converter of claim 4 wherein said n layer of said p-i-n photodetector is fabricated as a waveguide.

7. The integrated single-chip wavelength converter of claim 6 wherein said n layer is InGaAsP.

8. The integrated single-chip wavelength converter of claim 1 wherein said modulator further comprises:

a first n+ doped semiconductor layer deposited on the substrate of said chip;

an insulator layer deposited on said first n+ doped layer;

a first p+ doped semiconductor layer deposited on said insulator layer;

a second n+ doped semiconductor layer deposited on said first p+ doped layer;

an n doped semiconductor layer deposited on said second n+ doped layer;

a multiple quantum well formed on said n doped layer;

a p doped semiconductor layer deposited on said multiple quantum well layer; and a second p+ doped semiconductor layer deposited on said p doped layer.

9. The integrated single-chip wavelength converter of claim 8 wherein said p, n and n+ doped layers are fabricated from binary type semiconductor material.

10. The integrated single-chip wavelength converter of claim 9 wherein said binary material is indium phosphide.

11. The integrated single-chip wavelength converter of claim 8 wherein said insulator, first and second p+ doped layers are fabricated from tertiary type semiconductor material.

12. The integrated single-chip wavelength converter of claim 11 wherein said tertiary type semiconductor is indium gallium arsenide.

13. The integrated single-chip wavelength converter of claim 4 wherein said modulator includes at least one p layer and one n layer, further comprising at least one electrical contact deposited on said p layer of said p-i-n photodetector, said p layer of said modulator and a first terminating end of said resistor.

14. The integrated single-chip wavelength converter of claim 4 wherein a voltage bias is electrically connected to said n layer of said p-i-n photodetector.

15. The integrated single-chip wavelength converter of claim 4 wherein said modulator includes at least one p layer and one n layer, and a voltage bias is electrically connected to said n layer of said p-i-n photodetector.

* * * * *